C

(12) United States Patent
Zhang et al.

(10) Patent No.: US 8,871,601 B2
(45) Date of Patent: Oct. 28, 2014

(54) DIFFUSION BARRIERS

(71) Applicant: Intermolecular, Inc., San Jose, CA (US)

(72) Inventors: Xuena Zhang, San Jose, CA (US);
Mankoo Lee, Fremont, CA (US);
Dipankar Pramanik, Saratoga, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/728,934

(22) Filed: Dec. 27, 2012

(65) Prior Publication Data
US 2014/0183737 A1     Jul. 3, 2014

(51) Int. Cl.
| | | |
|---|---|---|
| *H01L 21/331* | (2006.01) | |
| *H01L 21/44* | (2006.01) | |
| *H01L 23/538* | (2006.01) | |
| *H01L 21/768* | (2006.01) | |
| *H01L 23/532* | (2006.01) | |
| *B82Y 10/00* | (2011.01) | |
| *B82Y 30/00* | (2011.01) | |

(52) U.S. Cl.
CPC ........ H01L 23/538 (2013.01); H01L 21/76841 (2013.01); H01L 23/53238 (2013.01); B82Y 10/00 (2013.01); B82Y 30/00 (2013.01); H01L 21/76873 (2013.01)
USPC ........... 438/343; 438/637; 438/653; 438/754; 438/758; 257/9; 257/40; 257/751; 257/E21.251; 257/E21.309; 257/E21.584

(58) Field of Classification Search
CPC ................... H01L 21/76841; H01L 21/76873; H01L 23/538; H01L 23/53238; B82Y 10/00; B82Y 30/00
USPC ........ 438/343, 637, 653, 754, 758; 257/9, 40, 257/751, E21.251, E21.309, E21.584
See application file for complete search history.

(56) References Cited

U.S. PATENT DOCUMENTS

| | | | |
|---|---|---|---|
| 6,503,835 B1 | 1/2003 | Lee | |
| 7,202,159 B2 | 4/2007 | Ganapathiraman et al. | |
| 7,309,658 B2 * | 12/2007 | Lazovsky et al. | ............. 438/754 |
| 7,368,377 B2 | 5/2008 | Whelan et al. | |
| 7,615,776 B2 | 11/2009 | Chaudhari | |
| 7,728,436 B2 | 6/2010 | Whelan et al. | |

(Continued)

OTHER PUBLICATIONS

Sai et al.; Adhesion behaviour of self-assembled alkanethiol monolayers on silver at different stages of growth; May 4, 2007; IOP Publishing; Journal of Physics D: Applied Physics, pp. 3182-3189.

(Continued)

*Primary Examiner* — Dao H Nguyen

(57) ABSTRACT

Embodiments of the present invention include diffusion barriers, methods for forming the barriers, and semiconductor devices utilizing the barriers. The diffusion barrier comprises a self-assembled monolayer (SAM) on a semiconductor substrate, where one surface of the SAM is disposed in contact with and covalently bonded to the semiconductor substrate, and one surface of the monolayer is disposed in contact with and covalently bonded to a metal layer. In some embodiments, the barrier comprises an assembly of one or more monomeric subunits of the following structure: Si—$(C_nH_y)$-$(LM)_m$ where n is from 1 to 20, y is from 2n−2 to 2n, m is 1 to 3, L is a Group VI element, and M is a metal, such as copper. In some embodiments, $(C_nH_y)$ can be branched, crosslinked, or cyclic.

18 Claims, 2 Drawing Sheets

(56) References Cited

U.S. PATENT DOCUMENTS

| | | |
|---|---|---|
| 8,088,687 B2 | 1/2012 | Yeom et al. |
| 2004/0180506 A1* | 9/2004 | Ramanath et al. ............ 438/343 |
| 2005/0285101 A1* | 12/2005 | Hanson et al. ................. 257/40 |
| 2013/0240830 A1* | 9/2013 | Seacrist et al. .................... 257/9 |

OTHER PUBLICATIONS

Caro et al.; Screening self-assembled monolayers as Cu diffusion barriers; Apr. 22, 2008; Elsevier B.V.; Microelectronic Engineering, pp. 2047-2050.

* cited by examiner

+

Cu

DIFFUSION BARRIERS

CROSS REFERENCE TO RELATED APPLICATIONS

This application is related to commonly owned U.S. patent application Ser. No. 13/728,889 filed on Dec. 27, 2012, which is herein incorporated by reference for all purposes.

FIELD OF THE INVENTION

One or more embodiments of the present invention relate to semiconductor devices and manufacturing.

BACKGROUND

A diffusion barrier layer is required during copper metallization in the processing of integrated circuits and semiconductor devices to prevent Cu diffusion under electrical bias during device operation. When copper contacts silicon material, copper silicide is formed, which consumes Cu and deteriorates electrical conduction. Cu incorporation into dielectric layers degrades the dielectric properties of the insulating layer, causing leakage currents, and leading to inferior device performance and failure. With feature sizes of devices decreasing down to below 20 nm, the thickness of the diffusion barrier layers has been further reduced to less than 1-2 nm. To achieve such a thin blocking layer is challenging.

Previous approaches to providing diffusion barriers have included the use of metal alloys. For example, Ti or Ta compounds or Cu alloys have been utilized. However, the 10-30 nm thickness of the barrier layer required when using metal alloys is incompatible with use with sub-100 nm feature sizes in next-generation devices. In addition, obtaining such a thin barrier by conventional vapor phase deposition methods is difficult without compromising the barrier layer structure or conformality and in preparing high aspect ratio features.

U.S. Pat. No. 7,202,159 to Ganapathiraman describes the use of self-assembled monolayers (SAMs) formed from substituted silanes as diffusion barriers. The silanes include organic moieties comprising alkyl or aromatic groups to provide a diffusion barrier function, and react with the silicon oxide substrate by reaction of an O-alkyl leaving group. However, only the aromatic groups tethered to the substrate via an alkyl linker showed any efficacy at preventing metal diffusion. Krishnamoorthy, et al. reported that MOS capacitors with SAMs with short tail lengths or aliphatic terminal groups were ineffective in hindering Cu diffusion, while SAMs terminated by aromatic rings showed longer failure times. The authors concluded that steric hindrance due to the terminal groups in the SAMs is responsible for the barrier properties. (Krishnamoorthy, A., et al. 2001 *Appl. Phys. Lett.* 78, 2467).

Khaderbad et al. describe metallated porphyrins as self-assembled monolayers on silicon substrates, and their use as Cu diffusion barriers. (Khaderbad, M. A et al. "Metallated Porphyrin Self Assembled Monolayers as Cu Diffusion Barriers for the Nano-scale CMOS Technologies", Proceedings of the 8th IEEE Conference on Nanotechnology, Aug. 18-21, 2008, Arlington, Tex. USA.) This reference teaches that the presence of aromatic rings sterically hinders Cu diffusion between molecules through the SAM layer. In addition, the authors suggest that the steric effect may be supplemented by the presence of metal ions in the center of the porphyrin macrocycle, and by the role of Cu—N bonds formed in the pyrrole subunits.

Caro et al. describe the use of a 3-aminopropyltrimethoxysilane-derived. SAM as a barrier against copper diffusion. The authors state that the SAM forms a carbon rich interface with the Cu overlayer, and the Cu did not penetrate through the SAM to the underlying silicon. These authors also describe use of a 3-mercaptopropyltrimethoxysilane-derived SAM in preparation of a Cu diffusion barrier, but report that this SAM did not prevent Cu penetration and silicide formation, and hence was ineffective. (Caro, A. M. et al. 2008 *Microelectronic Engineering* 85, 2047). Cam et al. also describe use of 3-mercaptopropyltrimethoxysilane-derived SAM as a sacrificial layer in preparation of a dual damascene integration scheme. (Caro, A. M., et al, 2010 *Adv. Funct. Mater.* 20, 1125).

SUMMARY OF THE INVENTION

Embodiments of the present invention include diffusion barrier layers, methods for forming the diffusion barriers, and semiconductor devices incorporating the diffusion barriers, wherein the diffusion barrier is operable to prevent migration of metal atoms through a self-assembled monolayer (SAM) to the semiconductor substrate, i.e., the layer acts as a diffusion barrier. A diffusion barrier layer in a semiconductor device comprises a SAM and a metal layer, wherein the SAM forms a monolayer on a surface of the semiconductor substrate having one surface of the monolayer disposed in contact with and covalently bonded to a semiconductor oxide layer on the semiconductor substrate and one surface of the monolayer disposed in contact with and covalently bonded to a metal atom in the metal layer. The SAM comprises an assembly of one or more subunits comprising a first functional group covalently bonded to a layer of a semiconductor oxide disposed on the semiconductor substrate and a second functional group covalently bonded to the metal. In some embodiments, the semiconductor is silicon or germanium. In some embodiments, the metal is copper. In some embodiments, the metal is Au, Ag, Al, Pt, Mo, or Ru.

In some embodiments, the self-assembled monolayer comprises one or more monomeric subunits of the following structure: —Si—$(C_nH_y)$-$(LM)_m$ where n is from 1 to 20, y is from 2n−2 to 2n, m is 1 to 3, L is a Group VI element, for example, S, Se, Te, but not O, and M is a metal such as Cu. Metal atoms on the surface of the metal layer in proximity to the SAM are covalently bonded to L moieties of the SAM. The hydrocarbon chain can be saturated, i.e., y=2n, for example, $(C_nH_y)$ can be —$C_{10}H_{20}$—. The hydrocarbon chain can be unsaturated, i.e., y=2n−2, for example, $(C_nH_y)$ can be —$C_{10}H_{28}$—. In some embodiments, $(C_nH_y)$ can be branched, crosslinked, or cyclic. In some embodiments, n is from 3 to 20. In some embodiments, n is from 4 to 20. In some embodiments, n is from 4 to 8. The leaving group X can be an O-alkyl group such as methoxy or ethoxy, or halo such as Cl. Where m is greater than one, the hydrocarbon chain is branched so that each hydrocarbon chain is terminated with a LH moiety.

Methods for forming a diffusion barrier layer comprise the steps of forming a SAM on a semiconductor oxide surface disposed on a semiconductor substrate, and depositing a metal on the SAM to form a metal layer. The SAM comprises an assembly of one or more monomers comprising a first functional group capable of covalently bonding to the semiconductor oxide and a second functional group capable of covalently bonding to the metal. The methods can further comprise preparing a semiconductor substrate, wherein preparing the semiconductor substrate comprises forming a semiconductor oxide on a surface of the semiconductor substrate. In some embodiments, the step of forming a SAM comprises contacting the semiconductor oxide surface with a solution comprising the one or more monomers and a solvent.

In some embodiments, the forming step is performed by contacting the semiconductor oxide surface with a gas comprising the one or more monomers using chemical vapor deposition. In some embodiments, the forming step further comprises heating the substrate and SAM such that the SAM is covalently bonded to the substrate.

In some embodiments, the step of depositing a metal on the SAM is performed by contacting the SAM with a solution comprising metal ions. In some embodiments, the step of depositing a metal on the SAM is performed by contacting the SAM with metal atoms using physical vapor deposition. In some embodiments, the metal is copper. In some embodiments, the metal is Au, Ag, Al, Pt, Mo, or Ru. In some embodiments, the methods further comprise depositing additional metal on the metal layer. In some embodiments, the methods further comprise depositing a layer on the metal layer.

In some embodiments, the first functional group of the monomer utilized in the methods is a silane. In some embodiments, the monomer has the structure $X_3$—Si—$(C_nH_y)$-LH where n is from 1 to 20, y is from 2n−2 to 2n, X is a leaving group, and L is a Group VI element, for example, S, Se, Te, etc. The hydrocarbon chain can be saturated, i.e., y=2n, for example, $(C_nH_y)$ can be —$C_{10}H_{20}$—. The hydrocarbon chain can be unsaturated, i.e., y=2n−2, for example, $(C_nH_y)$ can be —$C_{10}H_{18}$—. In some embodiments, $(C_nH_y)$ can be branched, crosslinked, or cyclic. In some embodiments, n is from 3 to 20. In some embodiments, n is from 4 to 20. In some embodiments, n is from 4 to 8. The leaving group X can be an O-alkyl group such as methoxy or ethoxy, or halo such as Cl. In some embodiments, the second functional group is a thiol (—SH).

DETAILED DESCRIPTION

Figure 1:
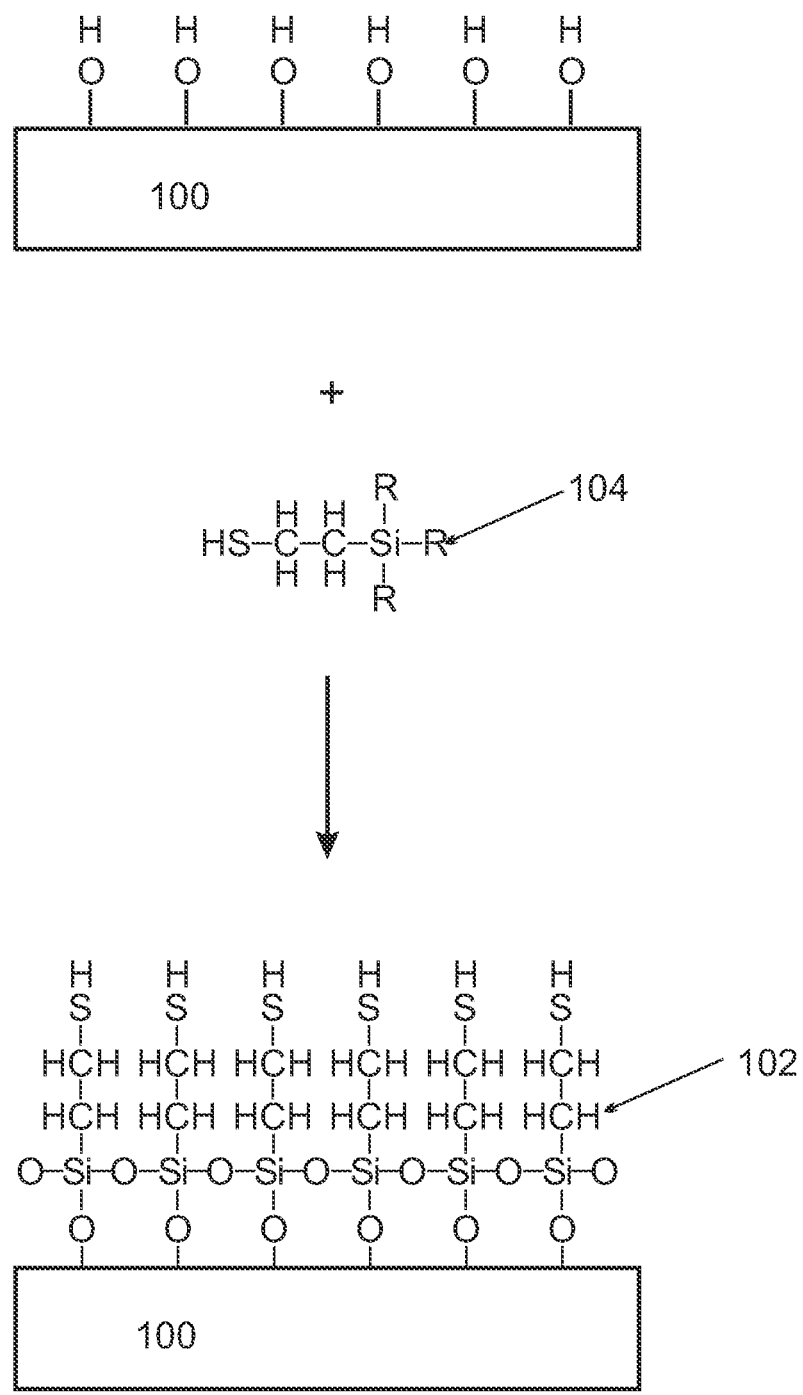
FIG. 1 shows a schematic illustration of one embodiment of a method for forming a diffusion barrier on a substrate.

Before the present invention is described in detail, it is to be understood that unless otherwise indicated this invention is not limited to specific coating compositions or specific substrate materials. Exemplary embodiments will be described for selected applications to semiconductor diffusion barriers, but other applications can also be envisioned. It is also to be understood that the terminology used herein is for the purpose of describing particular embodiments only and is not intended to limit the scope of the present invention.

It must be noted that as used herein and in the claims, the singular forms "a," "and" and "the" include plural referents unless the context clearly dictates otherwise. Thus, for example, reference to "a layer" includes two or more layers, reference to a solvent or monomer includes two or more solvents or monomers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention. Where the modifier "about" or "approximately" is used, the stated quantity can vary by up to 10%. Where the modifier "substantially equal to" is used, the two quantities may vary from each other by no more than 5%.

DEFINITIONS

The term "device" as used herein refers to a unit that is capable of performing some specific function. A device can include electrical, biological, and/or mechanical components, such as discrete electronic components. A device can also include components (e.g., transistor, resistor, diode, capacitor, etc.) of a particular type (e.g., electronic, magnetic, photonic, optoelectronic, magnetoelectronic, magnetooptic, molecular, etc.) on a substrate which can be active or passive, and can be formed of structures that effect the intended functions of the device.

The term "diffusion barrier" as used herein refers to a structure in a semiconductor device which effectively acts to prevent diffusion of components present in one location of the device from coming into contact with components of present in another location in the device. Such contact typically occurs due to diffusion over time and with application of voltages. A diffusion barrier is typically planar when it is part of a layered semiconductor device, but can be be nonplanar so long as a monolayer can be formed on a surface where the diffusion barrier is to be located.

The term "self-assembled monolayer" as used herein refers to organic molecules in molecular assemblies formed spontaneously on surfaces by adsorption and organized into large ordered domains.

The term "substrate" as used herein refers to a material having a rigid, semi-rigid, or flexible surface. Substrates can include supporting material(s) (such as a wafer) upon or within which a component or plurality of components (such as a test structure) is fabricated or to which a component is attached. Substrates include for example a plate, wafer, panel and/or disk of suitable material on and/or in which the components of a unit, such as an integrated or printed circuit, are deposited or formed. In many embodiments, at least one surface of the substrate will be substantially flat, although in some embodiments the substrate may include topological features such as dimples, wells, raised regions, etched trenches, or the like which can form all or part of components in a device.

The term "structure" as used herein refers to an arrangement, organization, and/or placement of one or more parts and/or elements. The structure can include topographical features, such as vias, holes, lines, trenches, and test structures, useful for extracting information about a process, identifying process problems, and improving a process as well as device performance. Test structures include device test structures, such as transistors, capacitors and diodes, process test structures, such as a 4-point probe structures, via chain structures, and continuity and isolation structures, circuit test structures, such as inverters and ring oscillators, and SEM test structures.

The term "wetting layer" as used herein refers to a layer that covers the substrate without leaving pinholes.

Embodiments of the present invention include diffusion barriers, methods for forming the diffusion barriers, and semiconductor devices incorporating the diffusion barriers, wherein the diffusion barrier is operable to prevent migration of metal atoms through a self-assembled monolayer (SAM) to the semiconductor substrate. A diffusion barrier layer in a semiconductor device comprises a SAM and a metal layer. The SAM forms a monolayer on a surface of a semiconductor substrate having one surface of the monolayer disposed in contact with and covalently bonded to a semiconductor oxide layer on the semiconductor substrate and one surface of the monolayer disposed in contact with and covalently bonded to a metal atom in the metal layer. The SAM comprises an assembly of one or more subunits comprising a first functional group covalently bonded to a layer of a semiconductor oxide disposed on the semiconductor substrate and a second functional group covalently bonded to a metal atom in the metal layer. In some embodiments, the semiconductor is silicon or germanium. In some embodiments, the metal is copper. In some embodiments, the metal is Au, Ag, Al, Pt, Mo, or Ru. The self-assembled monolayer covalently bonded to the metal comprises one or more monomeric subunits of the following structure: —Si—$(C_nH_y)$-$(LM)_m$ where n is from 1 to 20, y is from 2n–2 to 2n, m is 1 to 3, L is a Group VI element, and M is a metal. In some embodiments, n is from 3 to 20, m is 1, L is S, and M is Cu. The Si is covalently bonded to the Si—O—Si network of the silicon oxide layer on the silicon surface.

In some embodiments, monomers which form the self-assembled monolayer comprise three portions: i) a first functional group (a head group), i.e., a moiety that is capable of forming a chemical bond with the surface atoms on the substrate (the semiconductor oxide) in an exothermic reaction (e.g., having a ΔG of ~1.7 eV), resulting in the covalent bonding of the monomer to the substrate; and ii) a second functional group (a tail group), i.e., moiety that is capable of forming a covalent bond with a metal such as copper. A third portion of the monomer is iii) an alkyl or alkenyl chain, i.e., of the formula $(C_nH_y)$, where n is from 1 to 20, y is from 2n–2 to 2n connecting the first and second functional groups. The inter-chain van der Waals interactions between the alkyl chains assists in forming ordered molecular structure in the SAM, and is dependent on the density of covalently bonded head groups to the substrate. The thickness of the SAM is typically less than about 10 Å for n≈3.

In some embodiments, the SAM is formed from one or more monomers having the formula

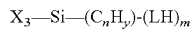

$X_3$—Si—$(C_nH_y)$-$(LH)_m$ where m is 1 to 3, L is a Group VI element, for example, S, Se, Te, but not O. The hydrocarbon chain can be saturated, i.e., y=2n, for example, $(C_nH_y)$ can be —$C_{10}H_{20}$—. The hydrocarbon chain can be unsaturated, i.e., y=2n–2, for example, $(C_nH_y)$ can be —$C_{10}H_{18}$—. In some embodiments, $(C_nH_y)$ can be branched, crosslinked, or cyclic. In some embodiments, n is from 1 to 20. In some embodiments, n is from 4 to 20. In some embodiments, n is from 4 to 8. The leaving group X can be an O-alkyl group such as methoxy or ethoxy, or halo such as Cl. In some embodiments, the metal is copper. In some embodiments, the metal is Au, Ag, Al, Pt, Mo, or Ru. In some embodiments, n is from 4 to 8, providing a SAM of thickness about 1-2 nm.

In some embodiments, monomers comprising thiolated silanes (e.g., silane —$(C_nH_y)$—SH) covalently bonded to Cu are used to form a copper diffusion barrier layer. The Cu-thiolated SAMs layer satisfy the following criteria: The head group of the silanes (Si—$R_3$) reacts with a $SiO_x$ substrate to form covalent Si—O bonds. Due to the ordered structure formed, these monolayers are tightly packed on the $SiO_x$ surfaces. The novel diffusion barrier layers provide dense packing of monomers and provide superior results compared with prior art barrier layers utilizing bulky aromatic groups and porphyrins in SAMs which result in defects and leakage pathways allowing Cu access to the silicon.

In addition, the thiol terminal group allows the control of surface properties of the subsequent Cu layer. The terminal thiol groups react with copper to form covalent Cu—S bonds, resulting in a complete wetting layer of copper on the SAM. The thickness of the resulting SAM can be tuned by choice of n (an integer number of carbons), and the thickness can be as thin as 1-2 nm. Copper diffusion through the Cu-thiolated SAMs is prevented because the copper atoms are covalently bonded to S; the bonding energy of Cu—S of ~276 KJ/mol is much larger than the bonding energy of Cu—Si, which is ~221 KJ/mol. Thus, copper bonds strongly with sulfur atoms instead of diffusing to $SiO_x$ and bonding with silicon atoms. The formed Cu-thiolated SAMs are very dense and have an ordered structure, which dramatically reduces the diffusion of Cu into the $SiO_x$ substrate.

In some embodiments, the semiconductor device comprises components which potentially put copper in contact with the semiconductor, for example, copper interconnects where the copper can diffuse into the silicon and form copper silicides. In some embodiments, the semiconductor device is a transistor, diode, capacitor, resistor, optoelectronic device and the like. In some embodiments, the semiconductor device is an integrated circuit, or a memory element, such as DRAM or ReRAM. In some embodiments, semiconductor devices comprise a silicon substrate, a SAM disposed on one surface of the silicon substrate, and a metal layer covalently bonded to the SAM; wherein the SAM comprises an assembly of one or more subunits comprising a first functional group covalently bonded to the silicon substrate and a second functional group covalently bonded to metal atoms in the metal layer. The semiconductor devices have improved performance due to the incorporation of the SAM and covalently bonded metal which act as an ultrathin diffusion barrier. The SAM is covalently bonded to a silicon oxide surface disposed on the silicon substrate.

Substrates

Substrates are not particularly limiting, and most commonly comprise semiconductors such as silicon, germanium, or silicon-germanium. The SAM monomer units have functional groups capable of covalently bonding to the substrate, and can be chosen to correspond with a particular substrate. For example, a silane will most commonly be used with a silicon substrate; a germane can be used with a germanium substrate, and so forth. The functional groups which react with the substrate surface are not limited to any particular chemical moieties so long as they satisfy the requirements of covalent bonding under acceptable reaction conditions and desired stability.

Methods for Preparing Diffusion Barrier Layers

Methods for forming a diffusion barrier comprise the steps of forming a SAM on a semiconductor oxide surface, and depositing a metal on the SAM to form a metal layer; wherein the SAM comprises an assembly of one or more monomers comprising a first functional group capable of covalently bonding to the semiconductor oxide and a second functional group capable of covalently bonding to a metal atom in the metal layer. The semiconductor oxide surface is disposed on a semiconductor substrate. The methods can further comprise preparing the semiconductor substrate, e.g., forming a semiconductor oxide on a surface of the semiconductor substrate. In some embodiments, the step of forming a SAM comprises contacting the semiconductor oxide surface with a solution comprising the one or more monomers and a solvent or solvents, which can comprise acids, bases or water to aid in the reaction with the substrate surface. Typical solvents include organic solvents such as toluene, hexane, dichloromethane, as well as alcohols such as ethanol, isopropanol, n-propanol, etc., and mixtures thereof. In some embodiments, the forming step is performed by contacting the semiconductor oxide surface with a gas comprising the one or more monomers using chemical vapor deposition. In some embodiments, the forming step further comprises heating the substrate and SAM such that the SAM is covalently bonded to the substrate.

In some embodiments, the step of depositing a metal on the SAM is performed by contacting the SAM with a solution comprising metal ions such that metal atoms covalently bond to the SAM. In some embodiments, the step of depositing a metal on the SAM is performed by contacting the SAM with metal atoms using physical vapor deposition. In some embodiments, the metal is copper. In some embodiments, the metal is Au, Ag, Al, Pt, Mo, or Ru. In some embodiments, the methods further comprise depositing additional metal on the metal layer, using physical vapor deposition or solution deposition. The thickness of the metal layer is typically a few nm, such as 3-20 nm. In some embodiments, the thickness of the metal layer is between 5-20 nm. In some embodiments, the methods further comprise depositing a layer on the metal layer.

In some embodiments, the first functional group is a silane. In some embodiments, the monomer has the structure $X_3$—Si—$(C_nH_y)$-LH where n is from 1 to 20, y is from $2n-2$ to $2n$, X is a leaving group, and L is a Group VI element, for example, S, Se, Te, but not O. The hydrocarbon chain can be saturated, i.e., $y=2n$, for example, $(C_nH_y)$ can be —$C_{10}H_{20}$—. The hydrocarbon chain can be unsaturated, i.e., $y=2n-2$, for example, $(C_nH_y)$ can be —$C_{10}H_{18}$. In some embodiments, $(C_nH_y)$ can be branched, crosslinked, or cyclic. In some embodiments, n is from 3 to 20. In some embodiments, n is from 4 to 20. In some embodiments, n is from 4 to 8. The leaving group X can be an O-alkyl group such as methoxy or ethoxy, or halo such as Cl. In some embodiments, the second functional group is a thiol (SH).

Figure 2:
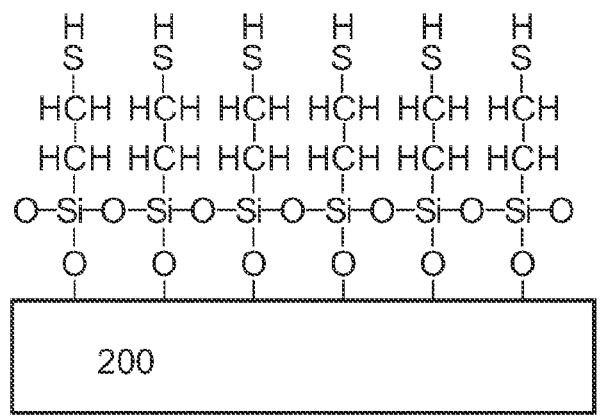
FIG. 2 shows a schematic illustration of one embodiment of a method for forming a diffusion barrier on a substrate.
Figure 2:
Figure 2:
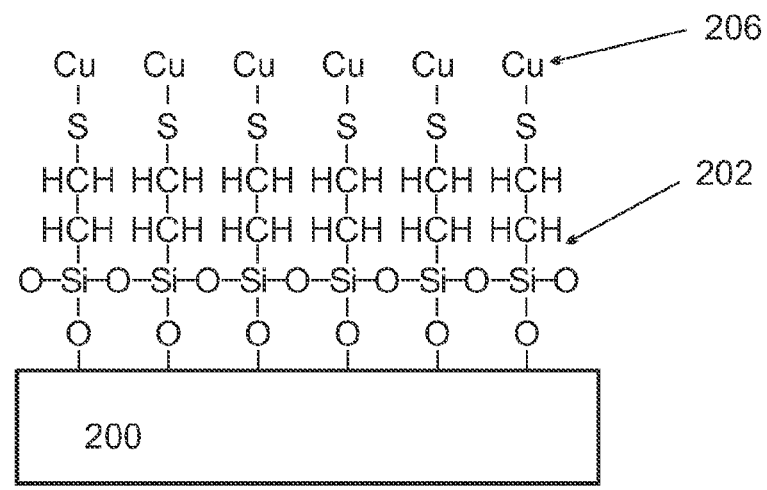

These steps are illustrated schematically in FIGS. 1 and 2. In FIG. 1, a substrate 100 having reactive hydroxyl groups is shown (e.g., silanol residues of an oxide layer on a silicon substrate, although the steps are the same for hydroxyl groups on a germanium substrate). A monomer 104 is placed into contact with the substrate 100 and forms a SAM 102 on the surface of substrate 100. Monomer 104 is shown as a silane thiol having a short alkyl chain, where n is 2, L is S, and m is 1. R is not shown specifically, but can be, for example, alkoxy. Monomers 104 self assemble into a SAM, and after heat treatment, are covalently bonded to substrate 100. A side view of the monolayer on the substrate is shown.

In FIG. 2, a substrate 200 is shown with a SAM 202 formed from the same monomer 104 depicted in FIG. 1. The substrate 200 with SAM 202 is contacted with metal to form metal layer 206, shown as copper. This diffusion barrier layer contains a thin layer of SAM formed from a silane having a short alkyl chain, where the thickness of the SAM is less than 10 Å and there is a single monolayer of Cu. The terminal thiol groups react with copper to form covalent Cu—S bonds, resulting in a complete wetting layer of copper on the SAM. The thickness of the Cu layer can be increased by addition of more Cu. Additional layers such as dielectric layers or interconnect layers (not shown) can be applied on the Cu layer when building a semiconductor device.

The solution comprising one or more monomers can be applied to the glass substrate using any convenient method, such as one or more methods selected from dip-coating, spin coating, spray coating, roll coating, or curtain coating. In some embodiments, the one or more monomers can be applied to the glass substrate using vapor deposition methods. For example, low molecular weight monomers can be provided via chemical vapor deposition. The gaseous monomers contact the glass substrate, and form a monolayer on the substrate. In particular, the first functional group capable of covalently bonding to the glass substrate can be a thiolated silane (e.g., $X_3$—Si—$(CH_2)_n$SH), where the $X_3$—Si— portion of the silane is polar and hydrogen bonds with the polar glass substrate, and the hydrocarbon portion of the silane is nonpolar and orients away from the glass surface.

The surface of the substrate can be treated to clean and activate the surface to optimize reaction of the functional group with the surface. When the first functional group is a silane, the surface of the substrate can be treated to clean and activate the surface to optimize reaction of the silane with the surface. For example, treatment with organic solvents can be used to remove adsorbed organic molecules. Exposure to strong acids or to an oxygen plasma can be used to remove adsorbed molecules. Exposure to an oxygen plasma can also be utilized to generate or regenerate an oxide layer on the surface of the substrate for reaction with the first functional group of the one or more monomers. In addition, for the reaction of silanes with a silica surface, some water should be present to enhance reactivity with the surface, either in the solvent(s) used to prepare the solution comprising one or more monomers, in the atmosphere contacting the substrate in a CVD process, or on the surface of the substrate.

Silicon substrates can be pretreated by standard cleaning or oxidizing protocols. For example, silicon substrates can be prepared by cleaning off organic residues and metal ions using the Standard Clean-1 (SC1) and the Standard Clean-2 (SC2) protocols. These procedures basically treat the silicon substrate with $H_2O_2$—$NH_4OH$—$H_2O$ (SC1), followed by $H_2O_2$—HCl—$H_2O$ (SC2) to further clean the surface. After the process, the silicon surface is clean and contains a thin oxide layer on its surface, which can then react with the functional groups on the SAM monomers. If desired, the surface can be further cleaned using one or more organic solvents. The surface can be oxidized to provide a layer of silica by heating the silicon substrate in an oxygen atmosphere if desired. The surface can also be treated with dilute HF (a 1:100 or 1:1000 dilution into water) to perform a surface etch. The substrate can then be oxidized by exposure to oxygen or an oxygen plasma to regenerate the $SiO_2$ surface layer.

The deposited thin films can be heat treated to remove excess solvent, and promote covalent bonding of the functional group with the substrate (e.g., to form —Si—O—Si— bonds with the SAM). After application to the substrate, the solution can be heated or processed at a temperature typically in the range of from about 20° C. to about 400° C. The solution and substrate can be heated together, or the coating may be selectively heated using methods such as IR laser annealing, UV RTP, or microwave processing.

After formation of the covalent bonds to the substrate surface, the metal layer can be formed. Methods of forming the metal layer are not particularly limiting. In some embodiments, the metal layer is formed by contacting the SAM with a solution comprising metal atoms or metal ions. In some embodiments, the metal layer is formed by contacting the SAM with metal atoms using physical vapor deposition or other suitable deposition methods. The metal layer can comprise any metal that forms a covalent bond with L, for example S. Suitable metals include Cu, Au, Ag, Al, Pt, Mo, or Ru, and the like. In some embodiments, the metal is copper and L is sulfur. After a wetting layer of metal is formed, additional metal thickness can be added to the substrate by any suitable deposition method, such as sputtering.

Advantages of the High Performance Copper Diffusion Barrier Layer

The high performance copper diffusion barrier layers and methods for preparing the diffusion layers described herein provide numerous advantages over previous solutions. Some of the advantages are as follows:

The growth process of the SAMs is easy to perform, either in solution by spin coating, dip coating, or by vapor deposition. The ease of manufacturing reduces overall manufacturing costs.

The SAMs process is easy to scale up to large size scales and large substrates (e.g., meters), which is advantageous for industrial applications.

The SAMs's head group reacts with the substrate surface via strong chemisorptions, leading to thermodynamically stable monolayers.

Higher Cu quality (uniform wetting layer) allows for use of a thinner copper barrier layer, enabling further reduction in features sizes according to Moore's law.

It will be understood that the descriptions of one or more embodiments of the present invention do not limit the various alternative, modified and equivalent embodiments which may be included within the spirit and scope of the present invention as defined by the appended claims. Furthermore, in the detailed description above, numerous specific details are set forth to provide an understanding of various embodiments of the present invention. However, one or more embodiments of the present invention may be practiced without these specific details. In other instances, well known methods, procedures, and components have not been described in detail so as not to unnecessarily obscure aspects of the present embodiments.

What is claimed is:

1. A method for forming a diffusion barrier, the method comprising:
    forming a self-assembled monolayer (SAM) on a semiconductor oxide surface, wherein the semiconductor oxide surface is disposed on a semiconductor substrate, and depositing a metal on the SAM to form a metal layer;
    wherein the SAM comprises an assembly of one or more monomers comprising a first functional group capable of covalently bonding to the semiconductor oxide surface and a second functional group capable of covalently bonding to a metal atom in the metal layer;
    wherein the monomer has the structure $X_3—S—(C_nH_y)-(LH)_m$ where n is from 1 to 20, y is from 2n−2 to 2n, X is a leaving group, m is 1 to 3, and L is a Group VI element; and
    wherein the diffusion barrier is operable to prevent migration of metal atoms through the SAM to the semiconductor substrate.

2. The method of claim 1, wherein the semiconductor is silicon or germanium.

3. The method of claim 1, further comprising preparing the semiconductor substrate, wherein preparing the semiconductor substrate comprises forming a semiconductor oxide on a surface of the semiconductor substrate.

4. The method of claim 1, wherein the step of forming a SAM comprises contacting the semiconductor oxide surface with a solution comprising the one or more monomers and a solvent.

5. The method of claim 1, wherein the step of forming a SAM comprises contacting the semiconductor oxide surface with a gas comprising the one or more monomers using chemical vapor deposition.

6. The method of claim 1, wherein the step of forming a SAM further comprises heating the substrate and SAM such that the SAM is covalently bonded to the substrate.

7. The method of claim 1, wherein the step of depositing a metal on the SAM is performed by contacting the SAM with a solution comprising metal ions.

8. The method of claim 1, wherein the step of depositing a metal on the SAM is performed by contacting the SAM with metal atoms using physical vapor deposition.

9. The method of claim 1, wherein the metal is Cu, Au, Ag, Al, Pt, Mo, or Ru.

10. The method of claim 1, further comprising depositing additional metal on the metal layer.

11. The method of claim 1, further comprising depositing a layer on the metal layer.

12. The method of claim 1, wherein the first functional group is a silane.

13. The method of claim 1, wherein L is S.

14. A semiconductor device comprising a diffusion barrier made according to the method of claim 1.

15. A diffusion barrier layer comprising a SAM and a metal layer,
    wherein the SAM forms a monolayer on a surface of a semiconductor substrate;
    wherein one surface of the monolayer is disposed in contact with a semiconductor oxide layer, and one surface of the monolayer is disposed in contact with the metal layer;
    wherein the semiconductor oxide layer is disposed on the semiconductor substrate;
    wherein one surface of the SAM is bonded to the semiconductor oxide and the other surface of the SAM is bonded to the metal;
    wherein the SAM comprises one or more monomeric subunits of the following structure: $—Si—(C_nH_y)-(LM)_m$ where n is from 1 to 20, y is from 2n−2 to 2n, m is 1 to 3, L is a Group VI element, and M is a metal; and
    wherein the diffusion barrier layer is operable to prevent migration of metal atoms through the SAM to the semiconductor substrate.

16. The diffusion barrier of claim 15, wherein the metal is Cu, Au, Ag, Al, Pt, Mo, or Ru.

17. The diffusion barrier of claim 15, wherein n is from 3 to 20, m is 1, L is S, and M is Cu.

18. A semiconductor device comprising a diffusion barrier layer, wherein the diffusion barrier layer comprises
    a SAM disposed on a semiconductor oxide surface, wherein the semiconductor oxide surface is disposed on a semiconductor substrate, and
    a metal layer;
    wherein the SAM comprises an assembly of one or more monomers each comprising a first functional group bonded to the semiconductor oxide and a second functional group bonded to metal atoms in the metal layer;
    wherein the SAM comprises one or more monomeric subunits of the following structure: $—Si—(C_nH_y)-(LM)_m$ where n is from 1 to 20, y is from 2n−2 to 2n, m is 1 to 3, L is a Group VI element, and M is a metal; and
    wherein the diffusion barrier layer is operable to prevent migration of metal atoms through the SAM to the semiconductor substrate.

* * * * *